(12) United States Patent
Sato

(10) Patent No.: US 9,793,238 B2
(45) Date of Patent: Oct. 17, 2017

(54) COPPER WIRE AND ELECTRODE JOINING METHOD AND JOINT STRUCTURE

(71) Applicant: TOYOTA JIDOSHA KABUSHIKI KAISHA, Toyota-shi, Aichi-ken (JP)

(72) Inventor: Yoh Sato, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/370,999

(22) Filed: Dec. 6, 2016

(65) Prior Publication Data

US 2017/0179075 A1    Jun. 22, 2017

(30) Foreign Application Priority Data

Dec. 21, 2015    (JP) .................................. 2015-248573

(51) Int. Cl.
*H01L 21/44*    (2006.01)
*H01L 23/34*    (2006.01)
*H01L 23/00*    (2006.01)

(52) U.S. Cl.
CPC .............. *H01L 24/85* (2013.01); *H01L 24/48* (2013.01); *H01L 2224/45565* (2013.01); *H01L 2224/48453* (2013.01); *H01L 2224/48824* (2013.01); *H01L 2224/78301* (2013.01); *H01L 2224/85035* (2013.01); *H01L 2224/85047* (2013.01); *H01L 2924/30101* (2013.01); *H01L 2924/35121* (2013.01)

(58) Field of Classification Search
CPC . H01L 2224/45147; H01L 2224/48247; H01L 2224/78301; H01L 2224/92247; H01L 2224/85; H01L 2224/05647; H01L 2224/48647; H01L 2224/48799; H01L 2224/48747; H01L 2224/29147; H01L 2224/85201; H01L 24/85
USPC ......... 438/612–615, 617; 257/719, 779, 780, 257/784
See application file for complete search history.

(56) References Cited

U.S. PATENT DOCUMENTS

| | | | |
|---|---|---|---|
| 2010/0213619 A1 | 8/2010 | Uno et al. | |
| 2010/0294532 A1 | 11/2010 | Uno et al. | |
| 2012/0193784 A1* | 8/2012 | Togasaki | H01L 24/48 257/737 |
| 2015/0145148 A1* | 5/2015 | Tran | H01L 24/13 257/780 |

FOREIGN PATENT DOCUMENTS

| | | |
|---|---|---|
| JP | 6297360 A | 5/1987 |
| JP | 5222339 B2 | 6/2013 |
| JP | 5572121 B2 | 8/2014 |
| WO | 2013/058020 A1 | 4/2013 |

\* cited by examiner

*Primary Examiner* — Hsien Ming Lee
(74) *Attorney, Agent, or Firm* — Oliff PLC

(57) ABSTRACT

With this copper wire joining method, a rubbed portion on which a coating remains between an electrode and a core wire is formed on the electrode. Then, after a capillary is moved away from the rubbed portion, and a ball is formed by melting a copper wire at a tip end of the capillary. Next, the ball is joined to the rubbed portion by pressing the ball against the rubbed portion.

13 Claims, 17 Drawing Sheets

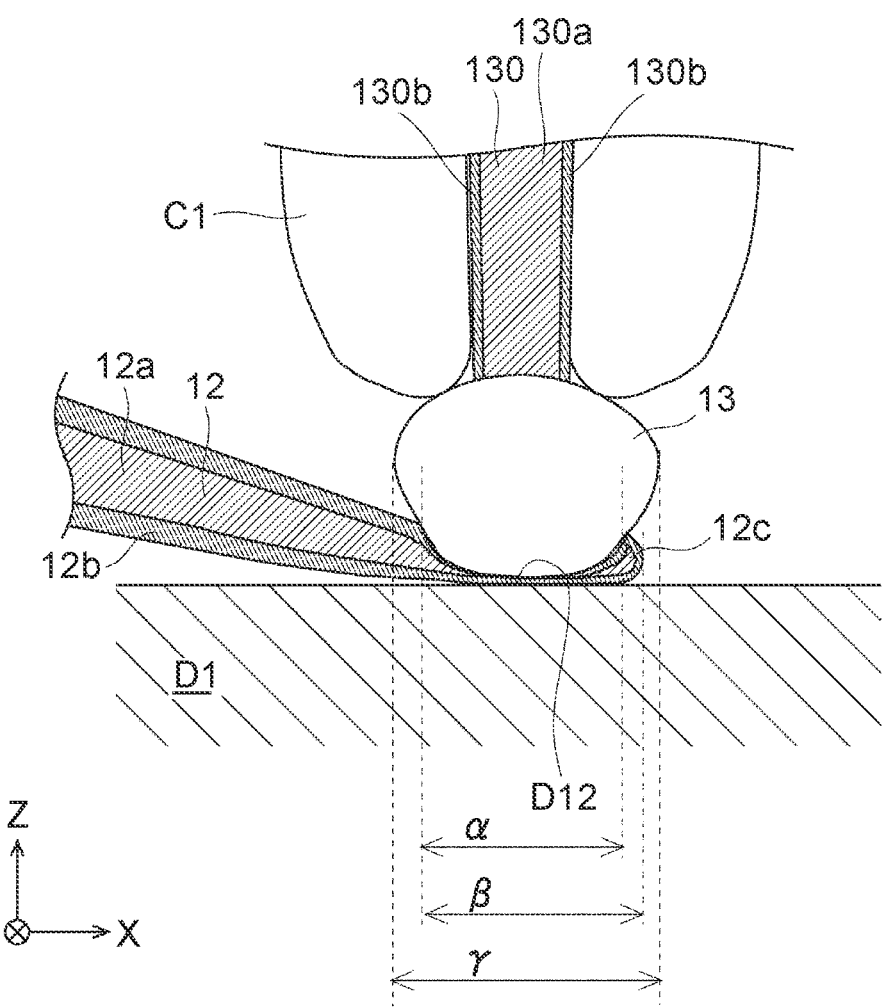

COPPER WIRE AND ELECTRODE JOINING METHOD AND JOINT STRUCTURE

INCORPORATION BY REFERENCE

The disclosure of Japanese Patent Application No. 2015-248573 filed on Dec. 21, 2015 including the specification, drawings and abstract is incorporated herein by reference in its entirety.

BACKGROUND

1. Technical Field

The disclosure relates to a copper wire and electrode joining method and joint structure.

2. Description of Related Art

There is a copper wire in which a core wire that includes copper (Cu) as a main component is covered with a coating that includes a noble metal as a main component. This kind of copper wire is described in Japanese Patent Application Publication No. 62-097360 (JP 62-097360 A), for example, and inhibits oxidation of the core wire, as well as a decrease in bondability.

SUMMARY

This kind of copper wire is sometimes joined to an electrode that includes aluminum (Al) as a main component using ball bonding. When ball bonding is performed with this kind of joining, the coating and the core wire melt almost simultaneously when the copper wire is heated and melted, so the core wire ends up being exposed at the joining surface of the copper wire and the electrode. Therefore, the core wire is no longer covered by the coating, and is thus joined directly to the electrode without the coating sandwiched in between the two. As a result, Cu atoms in the core wire and Al atoms in the electrode mutually diffuse, such that a Cu—Al compound layer is formed between the core wire and the electrode. Cracks tend to develop in this Cu—Al compound layer. As a result, the joining area of the copper wire and the electrode decreases, so the electrode and the copper wire peel apart. Also, the electrical resistance value sometimes increases.

The disclosure thus provides a copper wire and electrode joining method and joint structure that inhibits a decrease in durability of a joint between a copper wire, and an electrode that includes Al as a main component.

A first aspect of the disclosure relates to a joining method for joining a copper wire and an electrode together, the copper wire that has a core wire that includes copper as a main component, and a coating that covers the core wire and includes a noble metal as a main component. This joining method includes moving a capillary that is able to move in three-dimensional directions, along a surface of the electrode that includes aluminum as a main component, while feeding the copper wire out from a tip end of the capillary, and pressing the copper wire against the electrode; moving the capillary away from the electrode; heating the copper wire at the tip end of the capillary after moving the capillary away from the electrode; and pushing a ball formed by heating and melting the copper wire at the tip end of the capillary against a rubbed portion formed by pressing the copper wire against the electrode.

According to this kind of structure, the rubbed portion is formed by rubbing the core wire that is covered with the coating against the electrode, so the coating remains between the electrode and the core wire. As a result, the core wire does not directly contact the electrode. Because the ball is joined to the rubbed portion, joint strength is able to be ensured while inhibiting mutual diffusion of the copper atoms in the core wire and the aluminum atoms in the electrode. Therefore, the formation of a Cu—Al compound layer between the copper wire and the electrode is able to be inhibited, so a decrease in the durability of the joint of the copper wire, and the electrode that includes Al as a main component is inhibited. The capillary is made of ceramic or the like, and is harder than the electrode and the like. Therefore, the capillary may damage the electrode and the like when joining only the electrode and the rubbed portion. However, with the structure described above, the copper wire and the electrode are able to be joined with less likelihood that the electrode and the like will be damaged by the capillary compared to when joining only the electrode to the rubbed portion, by joining the copper wire to the electrode by pressing the ball against the rubbed portion with the capillary.

A second aspect of the disclosure relates to a joint structure that includes a copper wire that has a core wire that includes copper as a main component, and a coating that covers the core wire and includes a noble metal as a main component; an electrode that includes aluminum as a main component; a ball that is joined to a tip end of the copper wire, and that is made from the copper wire being melted and then solidified; and a disc-shaped body that is joined to the ball and the electrode, and that has a coating that includes a noble metal as a main component.

The copper wire and electrode joining method and joint structure according to the disclosure enables a decrease in the durability of the joint to be inhibited.

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 9 is a view showing a frame format of a different example of the details of a step of the copper wire joining method according to the first example embodiment.

DETAILED DESCRIPTION OF EMBODIMENTS

Figure 1:
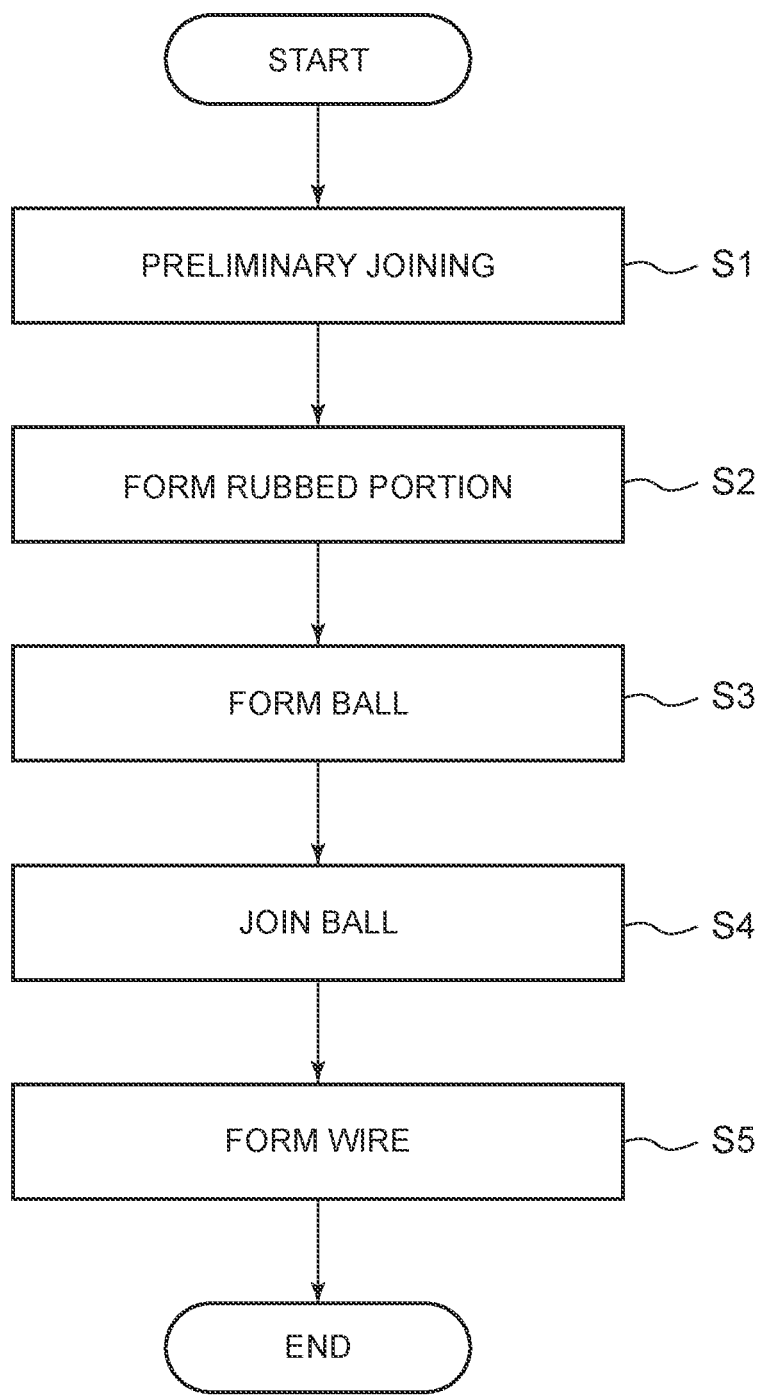
FIG. 1 is a flowchart illustrating a copper wire joining method according to a first example embodiment.

A copper wire joining method according to a first example embodiment will now be described with reference to FIGS. 1 to 3D. FIG. 1 is a flowchart illustrating a copper wire joining method according to the first example embodiment. FIGS. 2A to 2L are views showing frame formats of steps in the copper wire joining method according to the first example embodiment. FIGS. 3A to 3D are views showing frame formats of the details of the steps in the copper wire joining method according to the first example embodiment. In the drawings (FIGS. 2 to 9), a right-handed xyz three-dimensional coordinate system is provided as appropriate. The joining method of the first example embodiment connects a device-side electrode D1 to a lead frame-side electrode L1 using a copper wire. The device-side electrode D1 includes aluminum (Al) as its main component.

Figure 2A:
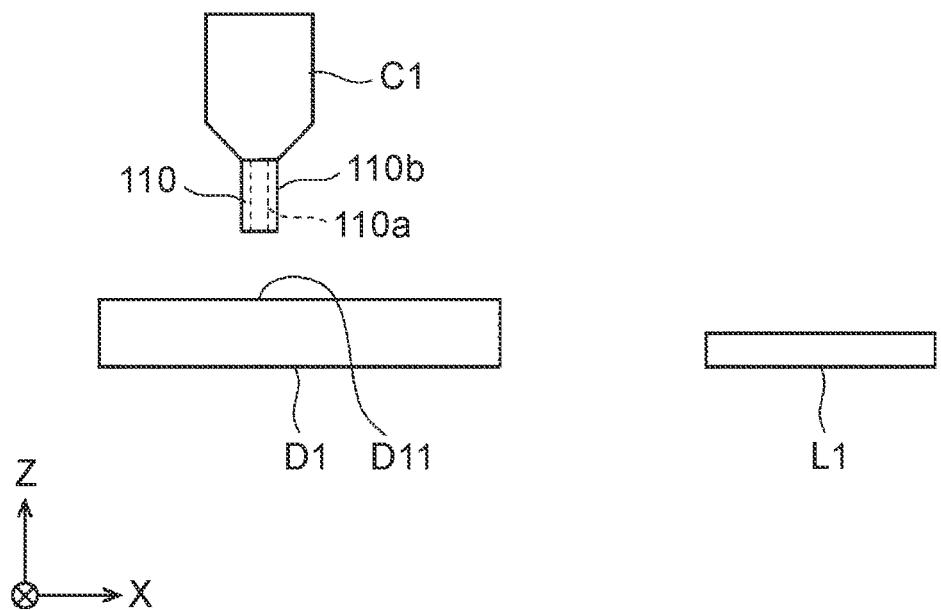
FIG. 2A is a view showing a frame format of a step in the copper joining method according to the first example embodiment.
Figure 2B:
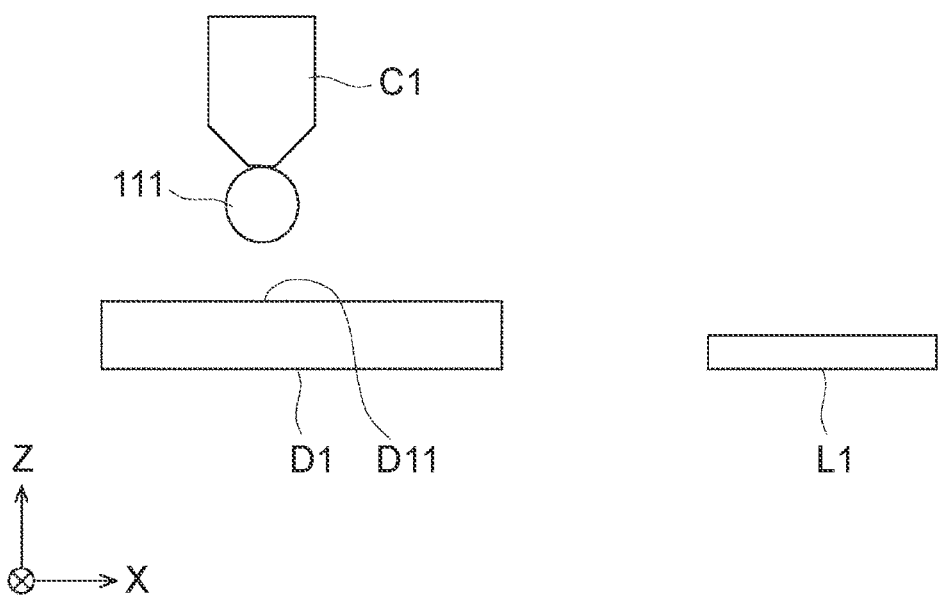
FIG. 2B is a view showing a frame format of a step in the copper joining method according to the first example embodiment.
Figure 2C:
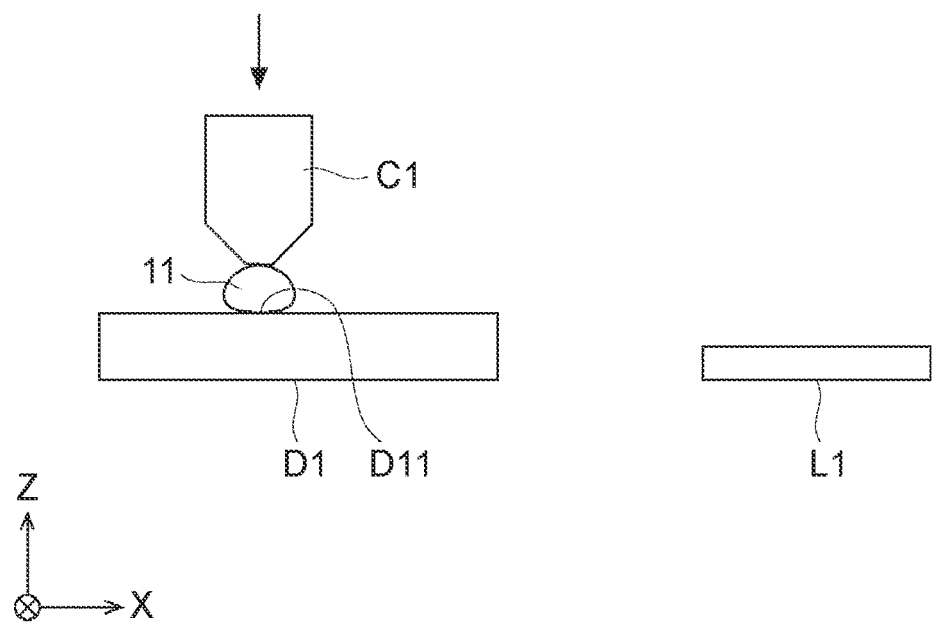
FIG. 2C is a view showing a frame format of a step in the copper joining method according to the first example embodiment.

As shown in FIGS. 2B and 2C, a preliminary bond 11 is formed at a preliminary joining region D11 (preliminary joining step S1).

More specifically, first, a wire 110 is drawn out from a tip end of a capillary C1, as shown in FIG. 2A. The wire 110 is a copper wire. More specifically, the wire 110 includes a core wire 110a that includes copper (Cu) as its main component, and a coating 110b that covers the core wire 110a. The coating 110b is made of material that inhibits Cu atoms and Al atoms from mutually diffusing. Some examples of this kind of material are a noble metal, and material that includes a noble metal as its main component. Also, some examples of such a noble metal are palladium (Pd), gold (Au), platinum (Pt), ruthenium (Ru), and silver (Ag). The core wire 110a and the coating 110b may also include added elements as necessary, as well as inevitable impurities. The capillary C1 is held so as to be able to move in three-dimensional directions. The capillary C1 is made of ceramic or the like, and is often harder than the electrode and the like. More specifically, the capillary C1 has a tube-like portion, and a clamp portion, not shown, that is arranged near a terminal end of this tube-like portion. The capillary C1 passes the wire 110 through the tube-like portion and holds the wire 110 by gripping the wire 110 with the clamp portion. The capillary C1 is able to sequentially feed the wire 110 out through the tip end of the tube-like portion by pushing the wire 110 out toward the tip end of the tube-like portion while gripping the wire 110 with the clamp portion. Also, used in conjunction with a torch electrode, for example, the capillary C1 is able to heat and melt the wire 110 at the tip end of the capillary C1, or more specifically, a portion of the wire 110 that is positioned near the tip end of the capillary C1, by discharging current from the torch electrode to the wire 110. The capillary C1 may also have an ultrasonic transducer, for example, and the wire 110 may be ultrasonically vibrated by transmitting the ultrasonic vibrations generated by this ultrasonic transducer to the wire 110. The capillary C1 may also be moved and the wire 110 and the like may be fed out or the like using a predetermined ball bonding apparatus, not shown.

Continuing on, the wire 110 is melted by discharging current using the torch electrode, not shown, while at least the environment around the wire 110 that has been drawn out from the tip end of the capillary C1 is filled with a reducing gas, as shown in FIGS. 2A and 2B. As a result, the shape of the wire 110 deforms from linear to spherical, such that a FAB (Free Air Ball) 111 is formed.

Continuing on, the preliminary bond 11 is formed by joining the FAB 111 to the device-side electrode D1 using ultrasonic waves, heat, or pressure, as appropriate, by bringing the capillary C1 close to the device-side electrode D1 and pressing the FAB 111 against the preliminary joining region D11 of the device-side electrode D1, as shown in FIGS. 2B and 2C. Forming the preliminary bond 11 enables a rubbed portion 12c to be easily formed in the next step, which is a rubbed portion forming step S2. That is, in this step, the preliminary bond 11 is preliminarily joined to the device-side electrode D1 in preparation for the rubbed portion forming step S2 which is next.

Next, the rubbed portion 12c is formed in a rubbed portion support region D12 of the device-side electrode D1 (rubbed portion forming step S2), as shown in FIGS. 2D to 2F and FIGS. 3A to 3C. Here, the rubbed portion support region D12 is in a position a predetermined distance away from the preliminary joining region D11 on the device-side electrode D1. More specifically, first, a wire 120 is fed out while the capillary C1 is moved from the preliminary bond 11 in a direction away from the device-side electrode D1 (here, toward the plus side in the Z direction), i.e., moved away from the preliminary bond 11. The wire 120 may be formed using a single wire that is continuous with the wire 110. This also applies to wires 130 and 140 described later. Typically, the wire 120 is the same continuous single wire as the wire 110 (see FIG. 2A), but is denoted by different reference characters for the purpose of illustration. The wire 120 has the same structure as the wire 110. That is, the wire 120 includes a core wire 120a, and a coating 120b that covers the core wire 120a. The core wire 120a and the coating 120b have the same structures as the core wire 110a and the coating 110b, respectively. The wires 130 and 140 that will be described later are also the same continuous single wire, but will be denoted by different reference characters for the purpose of illustration, just like the wire 120.

Figure 2D:
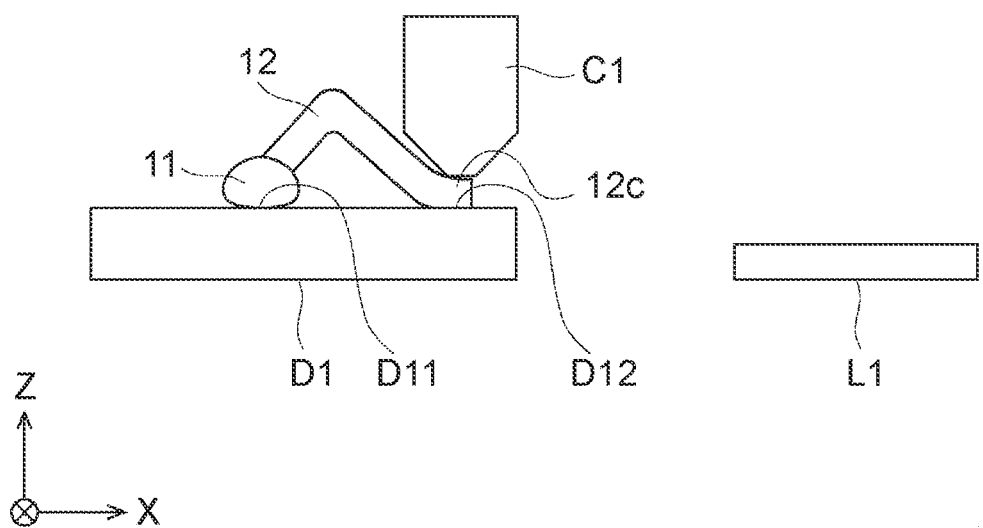
FIG. 2D is a view showing a frame format of a step in the copper joining method according to the first example embodiment.
Figure 3A:
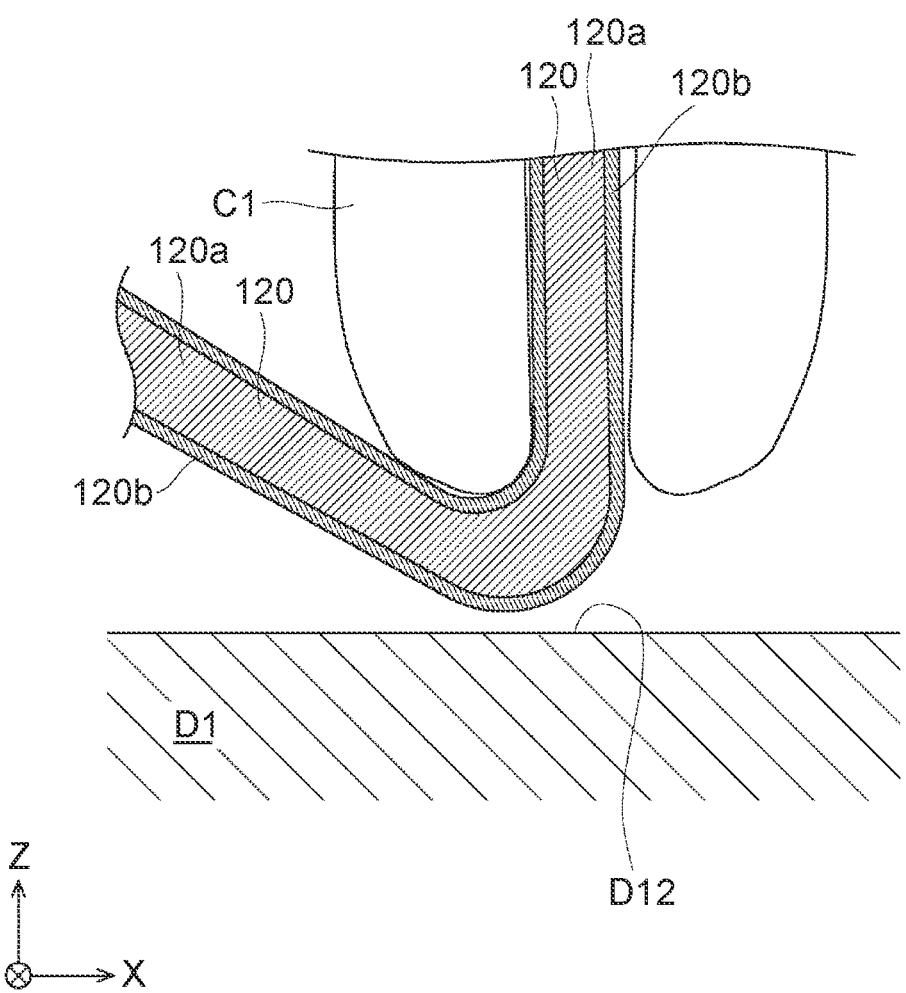
FIG. 3A is a view showing a frame format of the details of a step in the copper joining method according to the first example embodiment.
Figure 3B:
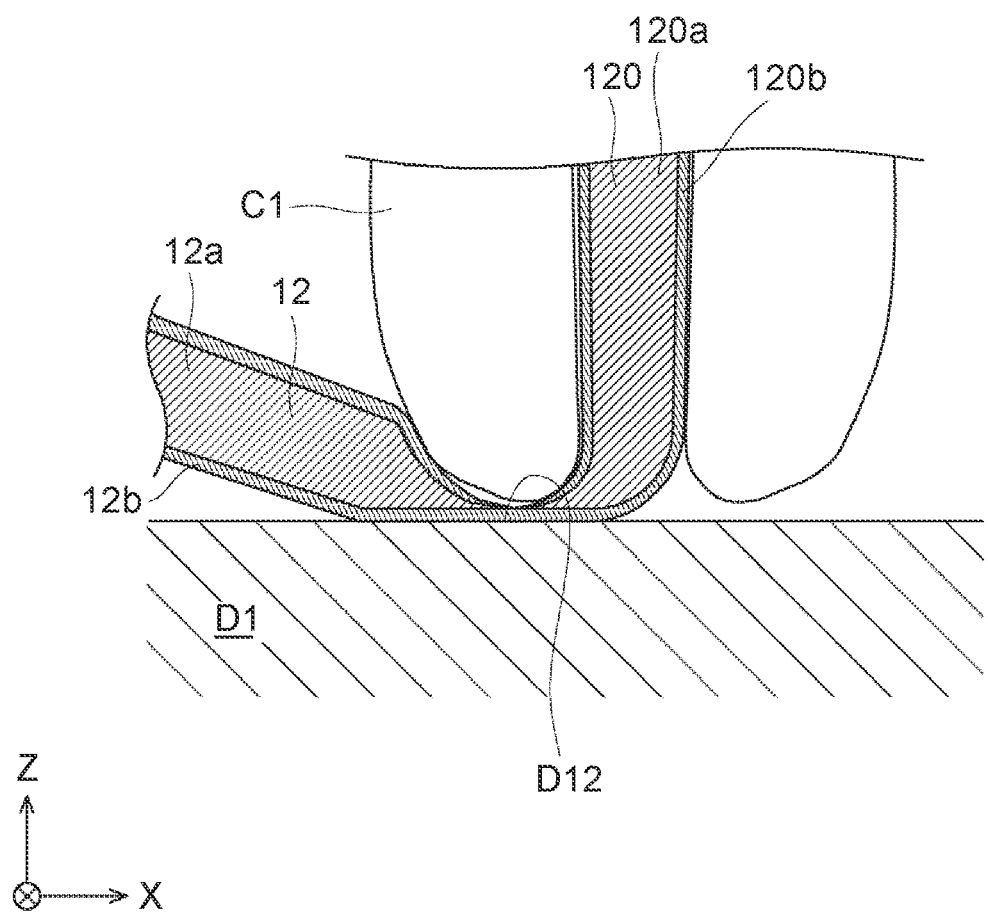
FIG. 3B is a view showing a frame format of the details of a step in the copper joining method according to the first example embodiment.

The wire 120 is pressed against the rubbed portion support region D12 of the device-side electrode D1 by bringing the capillary C1 close to the device-side electrode D1, while continuing to feed the wire 120 out from the capillary C1, as shown in FIG. 2D and FIGS. 3A and 3B. Hatching of the capillary C1 is omitted in FIGS. 3A to 3D for viewability. Moreover, the capillary C1 is moved in a specific direction (here, toward the plus side of the X axis) on the surface of the rubbed portion support region D12 while the wire 120 is pushed against the rubbed portion support region D12 of the device-side electrode D1. As a result, the wire 120, or more specifically, a portion of the wire 120 that is on the capillary C1 side and therearound is rubbed against, and joined to, the rubbed portion support region D12 of the device-side electrode D1. Therefore, a first wire 12 that extends in a direction away from the device-side electrode D1 is formed while extending from the preliminary bond 11 toward the rubbed portion support region D12 of the device-side electrode D1. The first wire 12 includes a core wire 12a, and a coating 12b that covers the core wire 12a. The core wire 12a and the coating 12b correspond to the core wire 120a and the coating 120b, respectively. Also, the capillary C1 may be moved along a predetermined path as necessary to bend the wire 120.

Figure 2E:
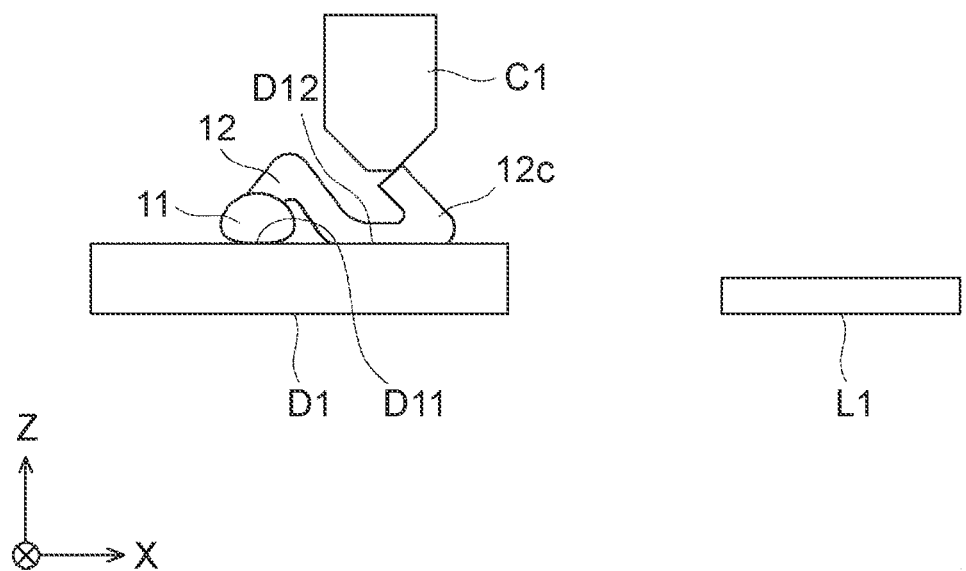
FIG. 2E is a view showing a frame format of a step in the copper joining method according to the first example embodiment.
Figure 2F:
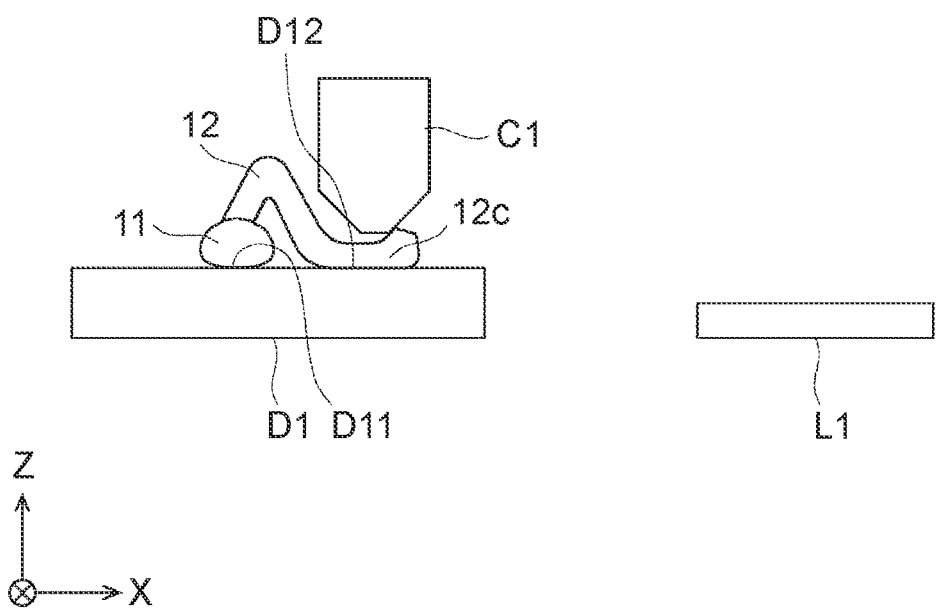
FIG. 2F is a view showing a frame format of a step in the copper joining method according to the first example embodiment.
Figure 3C:
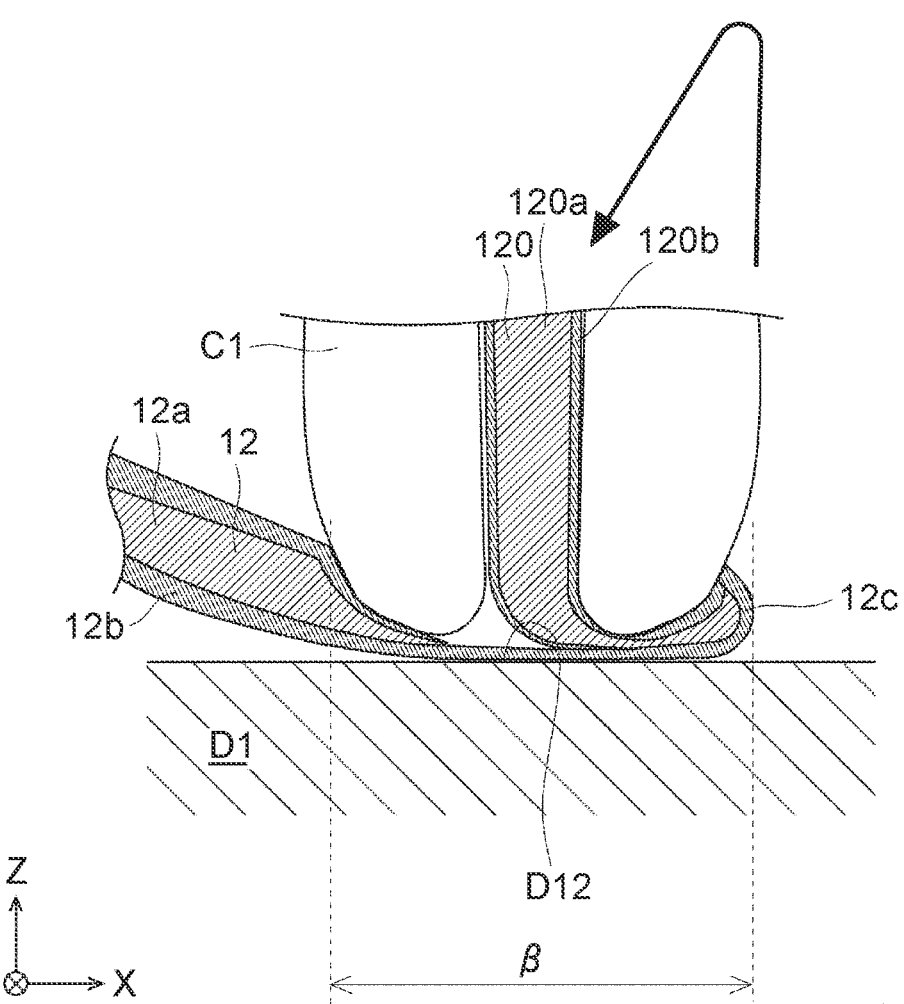
FIG. 3C is a view showing a frame format of the details of a step in the copper joining method according to the first example embodiment.

Continuing on, the rubbed portion 12c may also be formed on the rubbed portion support region D12 by returning the wire 120 to the preliminary bond 11 side while feeding the wire 120 out (a step-back step), as shown in FIGS. 2E and 2F. More specifically, the capillary C1 is moved upward (here, toward the plus side of the Z axis) from the rubbed portion support region D12 of the device-side electrode D1, as shown in FIG. 3C. Then the capillary C1 is moved toward the preliminary joining region D11 side of the device-side electrode D1. In other words, the capillary C1 is moved in the opposite direction (here, toward the minus side of the X axis) of the specific direction described above (here, the plus side of the X axis (see FIG. 2D and FIGS. 3A and 3B)). Here, the length of the flat rubbed portion 12c to which a ball bond 13 is able to be joined is able to be increased in the specific direction by rubbing the flat rubbed portion 12c in the opposite direction of the specific direction. As a result, the amount of the wire 120 used to form the rubbed portion 12c necessary for joining the ball bond 13 is able to be reduced. Also, the rubbed portion 12c is able to be formed more widely along the surface of the rubbed portion support region D12 than it is with a method that forms the rubbed portion 12c by breaking off the wire 120 after moving the capillary C1 in the specific direction. Furthermore, the wire 120 is joined by pushing the wire 120 against an area near the center of the rubbed portion support region D12. The amount of movement of the capillary C1 is preferably within a range of 40% to 60% of the diameter of the tip end portion of the capillary C1. When moving the capillary C1 in these ways, the wire 120 that has been fed out preferably continues on without being broken off from the capillary C1.

In this way, the rubbed portion 12c is formed on the rubbed portion support region D12. The rubbed portion 12c is a disc-shaped body that has a larger area than the cross-section of the wire 120. The rubbed portion 12c is a circular plate body with a diameter β, for example, and is circular, for example, when the device-side electrode D1, or more specifically, the surface of the rubbed portion support region D12, is viewed from above (in this case, from the plus side of the Z axis). The rubbed portion 12c may have a shape that makes it easy to support the ball bond 13 (also simply referred to as the "ball"; see FIG. 3D), described later. For example, the rubbed portion 12c may have a shape in which the area near the center is recessed toward the device-side electrode D1 side. By performing the step-back step described above, the rubbed portion 12c has a shape in which the area near the center is recessed toward the device-side electrode D1 side, which makes it easier to support the ball bond 13. Also, the coating 12b may remain between the rubbed portion support region D12 and the core wire 12a and 120a, inside the rubbed portion 12c. Also, by leaving the coating 12b on the surface of the rubbed portion 12c that contacts the device-side electrode D1, the rubbed portion 12c more reliably isolates the device-side electrode D1 from the core wire 12a that remains in the rubbed portion 12c. Also, the rubbed portion 12c more reliably isolates the ball bond 13 from the device-side electrode D1. As a result, a decrease in the durability of the joint between the copper wire and the device-side electrode D1 is more reliably inhibited.

The ball bond 13 is formed (ball forming step S3) in the same manner as the preliminary joining step S1, as shown in FIGS. 2G to 2I and FIG. 3D. The ball bond 13 may also be referred to simply as the "ball 13".

Figure 2G:
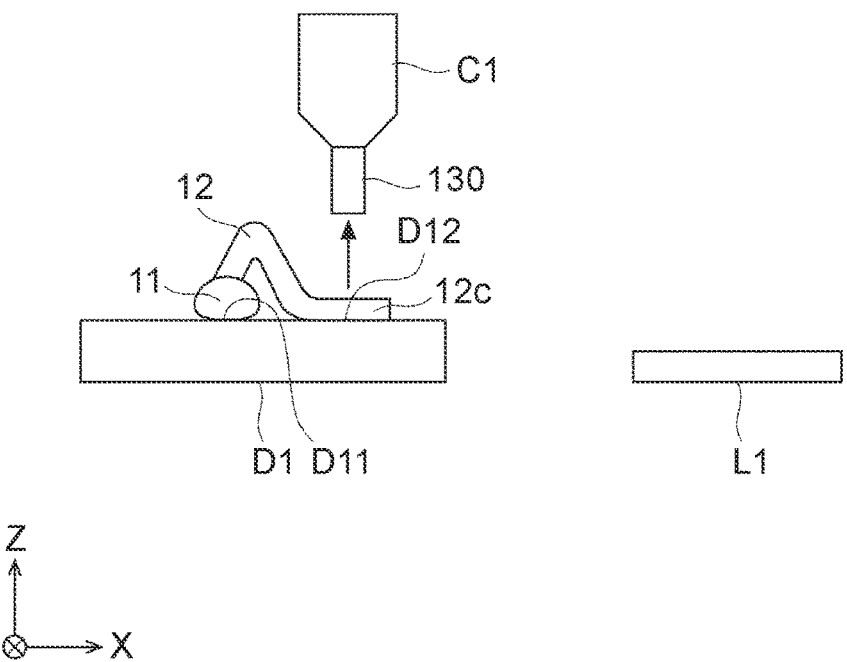
FIG. 2G is a view showing a frame format of a step in the copper joining method according to the first example embodiment.
Figure 3D:
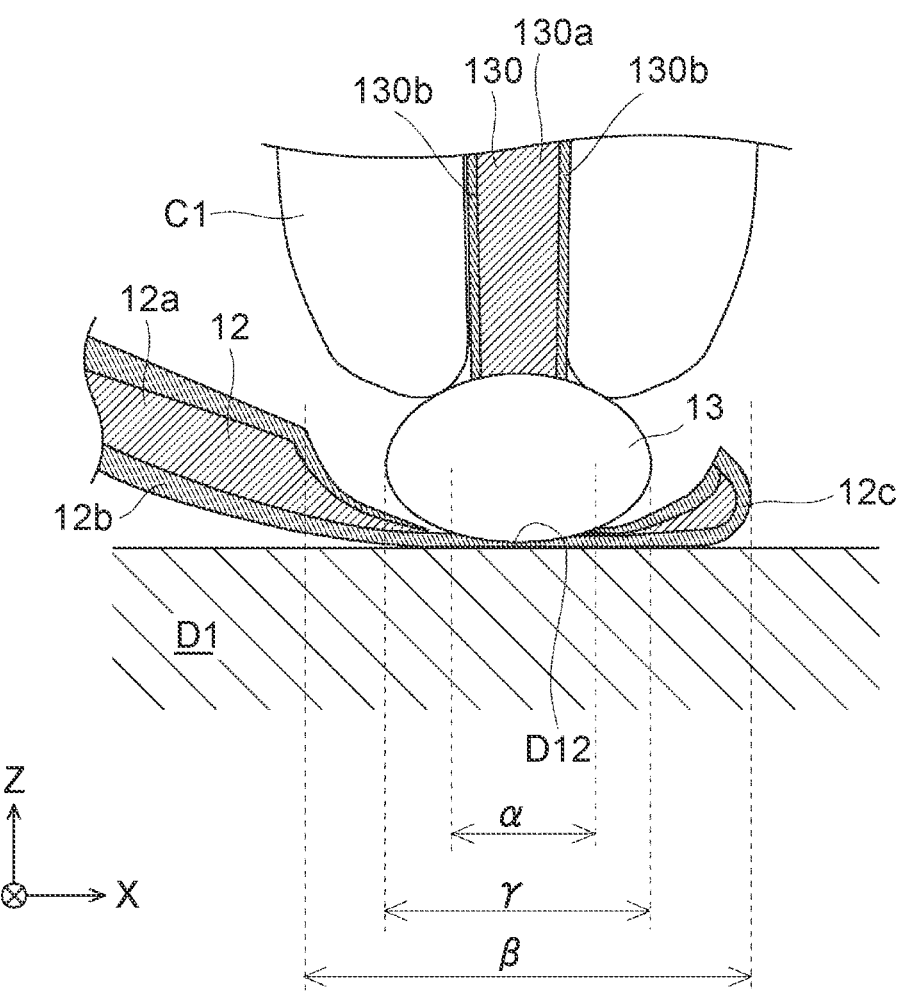
FIG. 3D is a view showing a frame format of the details of a step in the copper joining method according to the first example embodiment.

More specifically, first, the capillary C1 is moved upward (here, toward the plus side of the Z axis) away from the rubbed portion 12c, and the wire 130 is drawn out from the tip end of the capillary C1, as shown in FIG. 2G. The wire 130 has the same structure as the wire 110 (see FIG. 2A). That is, the wire 130 includes a core wire 130a, and a coating 130b that covers the core wire 130a, as shown in FIG. 3D. The core wire 130a and the coating 130b have the same structures as the core wire 110a and the coating 110b, respectively.

Figure 2H:
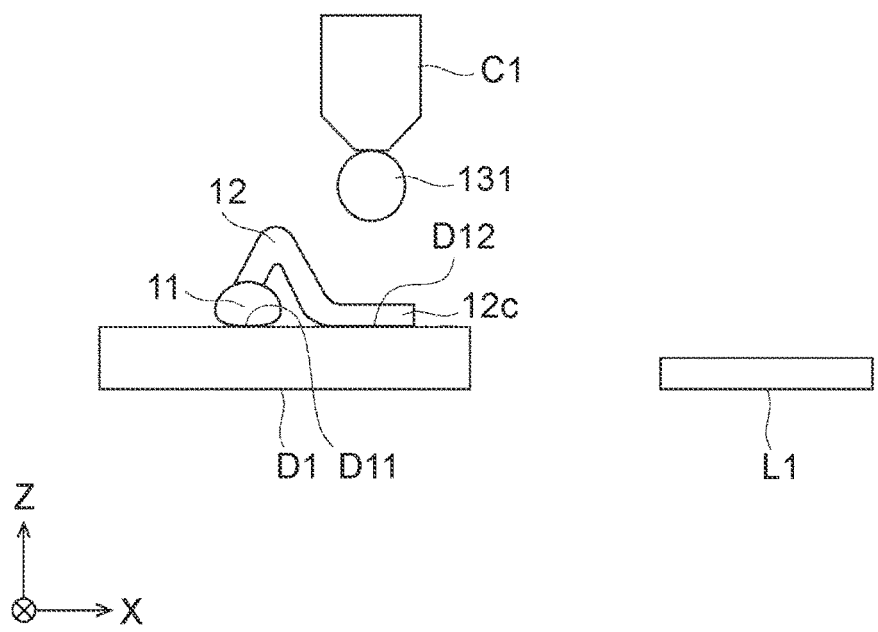
FIG. 2H is a view showing a frame format of a step in the copper joining method according to the first example embodiment.

Continuing on, the wire 130 is melted by discharging current using the torch electrode, not shown, while at least the environment around the wire 130 is filled with a reducing gas, as shown in FIGS. 2G and 2H. As a result, the shape of the wire 130 that has been drawn out from the tip end of the capillary C1 changes from linear to spherical, such that a FAB 131 is formed.

Figure 2I:
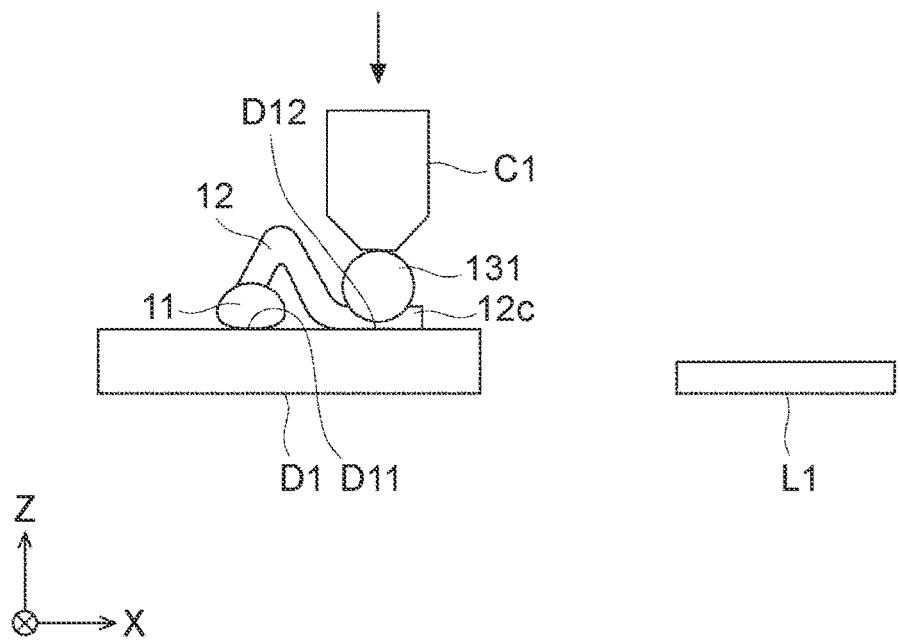
FIG. 2I is a view showing a frame format of a step in the copper joining method according to the first example embodiment.

Continuing on, as shown in FIGS. 2I and 3D, the ball bond 13 is formed by bringing the capillary C1 close to the device-side electrode D1, pressing the FAB 131 against the rubbed portion 12c, and joining the FAB 131 to the rubbed portion 12c using ultrasonic waves, heat, or pressure (ball joining step S4). Here, the ball bond 13 is joined to the rubbed portion 12c such that the joining surface between the ball bond 13 and the rubbed portion 12c fits to the inside of an outer edge of the rubbed portion 12c, when the surface of the device-side electrode D1 is viewed from a direction perpendicular to the surface of the device-side electrode D1 (here, from the plus side of the Z axis). More specifically, the FAB 131 may be pressed against the rubbed portion 12c such that the FAB 131 fits to the inside of the outer edge of the rubbed portion 12c, when the surface of the device-side electrode D1 is viewed from a direction perpendicular to the surface of the device-side electrode D1 (here, from the plus side of the Z axis). The joining surface between the ball bond 13 and the first wire 12 has a circular shape with a diameter α, for example, or has a shape that includes this circular shape. The diameter α of the joining surface between the ball bond 13 and the rubbed portion 12c, and the diameter β of the rubbed portion 12c satisfy Relational expression 1 below.

$$\beta > \alpha \quad \text{(Relational expression 1)}$$

The diameter β of the rubbed portion 12c shown in FIG. 3D is larger than a diameter γ of the ball bond 13, but the diameter β of the rubbed portion 12c may also be smaller than the diameter γ of the ball bond 13, as shown in FIG. 9. In FIG. 9, hatching of the capillary C1 is omitted for viewability.

Figure 2J:
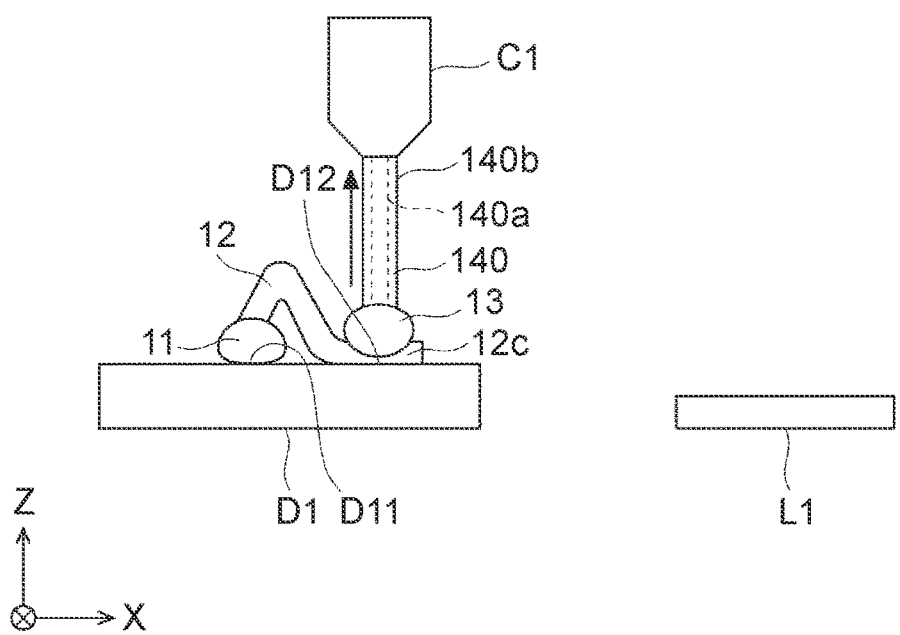
FIG. 2J is a view showing a frame format of a step in the copper joining method according to the first example embodiment.
Figure 2K:
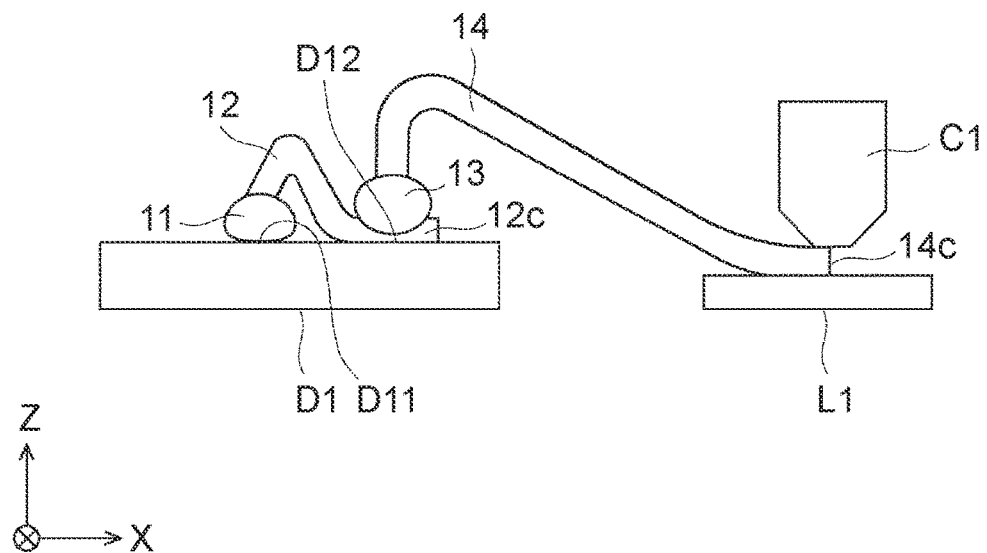
FIG. 2K is a view showing a frame format of a step in the copper joining method according to the first example embodiment.
Figure 2L:
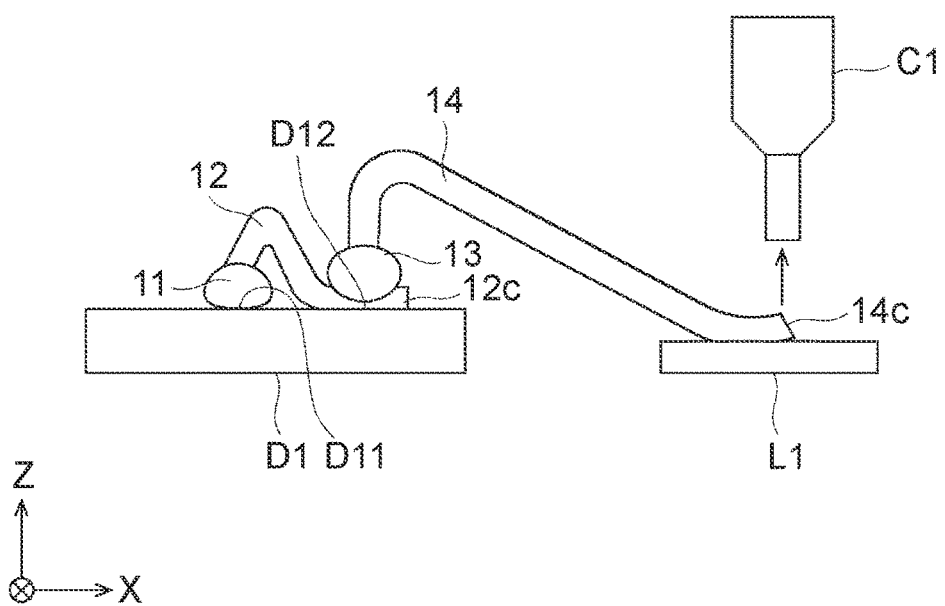
FIG. 2L is a view showing a frame format of a step in the copper joining method according to the first example embodiment.

Continuing on, a second wire 14 is formed (wire forming step S5), as shown in FIGS. 2J to 2L. This second wire 14 extends in a bridge shape from the ball bond 13 to the lead frame-side electrode L1, and electrically connects the ball bond 13 to the lead frame-side electrode L1. The second wire 14 includes a stitch bond 14c that directly connects with the lead frame-side electrode L1.

More specifically, the wire 140 is fed out from the capillary C1 while the capillary C1 is moved from the ball bond 13 in a direction away from the device-side electrode D1 (e.g., toward the plus side of the Z axis), as shown in FIG. 2J. The wire 140 is the same continuous wire as the wire 110 (see FIG. 1), and has the same structure as the wire 110 (see FIG. 1). The wire 140 includes a core wire 140a, and a coating 140b that covers the core wire 140a. The core wire 140a and the coating 140b have the same structures as the core wire 110a and the coating 110b, respectively.

Continuing on, as shown in FIG. 2K, the capillary C1 is moved to the lead frame-side electrode L1 while the wire 140 continues to be fed out from the capillary C1. Moreover, the wire 140 is pushed against the lead frame-side electrode L1 by bringing the capillary C1 close to the lead frame-side electrode L1. As a result, the stitch bond 14c is formed by joining the end portion of the second wire 14 that is on the capillary C1 side with the lead frame-side electrode L1. Then, as shown in FIG. 2L, the capillary C1 is moved away from the second wire 14, and the stitch bond 14c is cut away from the wire 140 that is fed out from the capillary C1.

Figure 4:
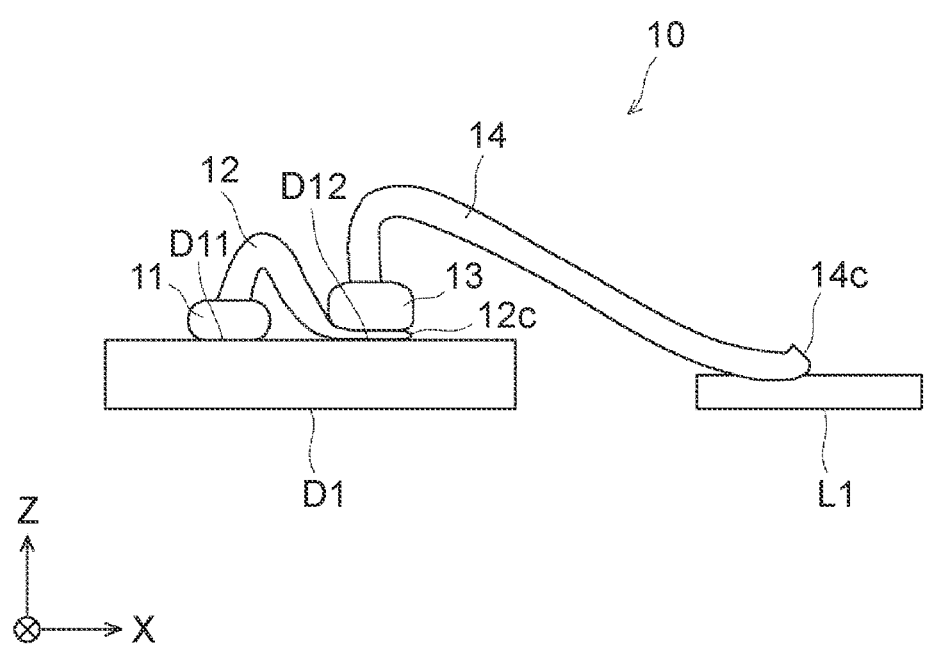
FIG. 4 is a side view of one example of a joint structure formed using the copper wire joining method according to the first example embodiment.

In this way, the wire 110, 120, 130, and 140, i.e., the copper wire, is able to be joined to the device-side electrode D1 and the lead frame-side electrode L1. Consequently, a joint structure 10 such as that such in FIG. 4 is able to be manufactured. The rubbed portion 12c is formed by rubbing the core wire 12a that is covered with the coating 12b against the device-side electrode D1, so the coating 12b remains between the electrode D1 and the core wire 12a. As a result, the core wire 12a does not directly contact the electrode D1. Because the ball bond 13 is joined to the rubbed portion 12c, joint strength is able to be ensured while inhibiting mutual diffusion of the copper atoms in the core wire 12a and the aluminum atoms in the electrode D1. The capillary C1 is made of ceramic or the like, and is harder than the electrode D1 and the like. Therefore, the capillary C1 may damage the electrode D1 and the like when joining only the electrode D1 and the rubbed portion 12c. However, with the structure described above, the wire 120 is able to be joined to the electrode D1 with less likelihood that the electrode D1 and the like will be damaged by the capillary C1 compared to when joining only the electrode D1 and the rubbed portion 12c, by joining the wire 120 to the electrode D1 by pressing the ball bond 13 against the rubbed portion 12c with the capillary C1.

(Example of Joint Structure)

Figure 5:
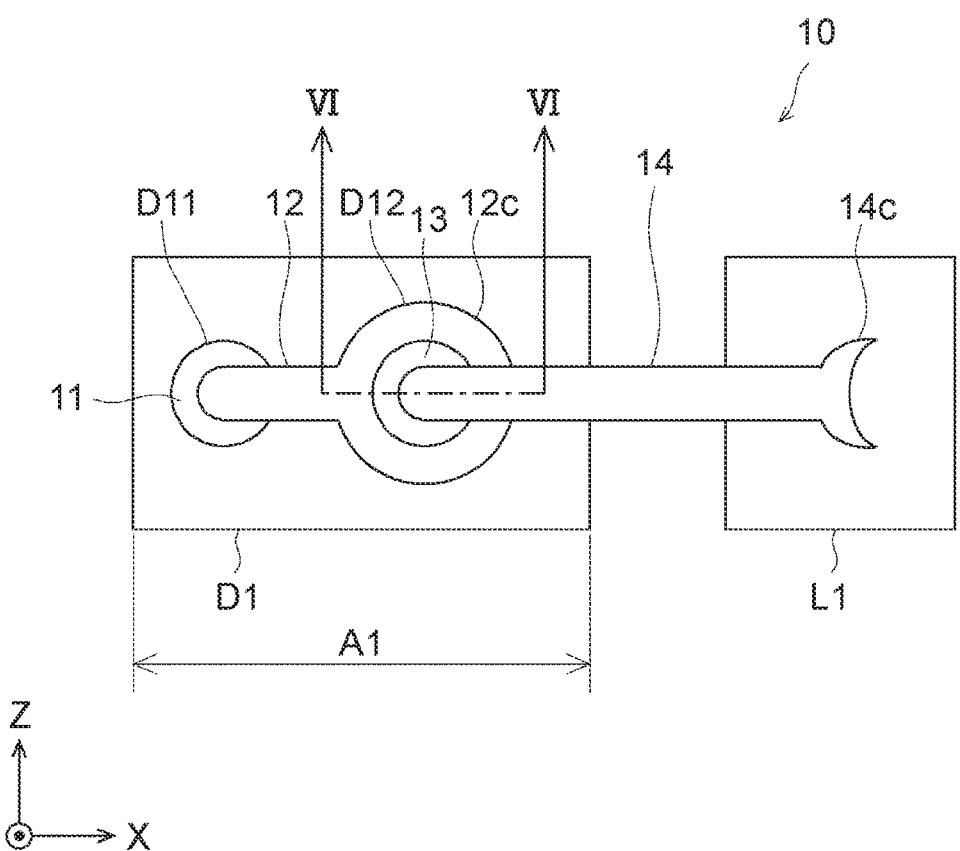
FIG. 5 is a plan view of the example of the joint structure formed using the copper wire joining method according to the first example embodiment.
Figure 6:
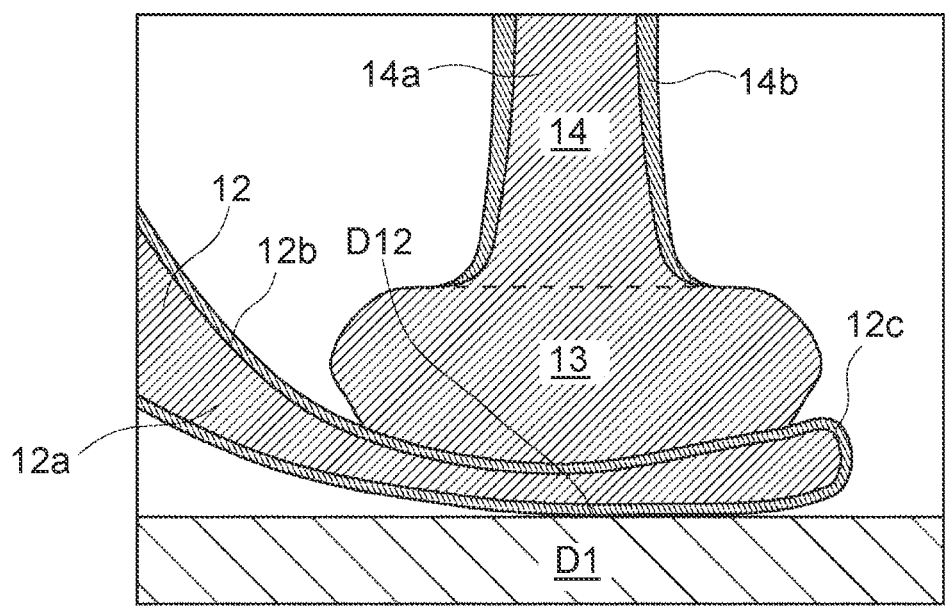
FIG. 6 is a sectional view of the example of the joint structure formed using the copper wire joining method according to the first example embodiment.

Next, a joint structure formed using the copper wire joining method according to the first example embodiment will be described with reference to FIGS. 4 to 6. FIG. 4 is a side view of one example of a joint structure formed using the copper wire joining method according to the first example embodiment. FIG. 5 is a plan view of the example of the joint structure formed using the copper wire joining method according to the first example embodiment. FIG. 6 is a sectional view of the example of the joint structure formed using the copper wire joining method according to the first example embodiment.

As shown in FIGS. 4 to 6, the ball bond 13 is connected to the device-side electrode D1 with the rubbed portion 12c of the first wire 12 sandwiched in between. Also, the second wire 14 extends from the ball bond 13 and is connected to the lead frame-side electrode L1. Therefore, with the joint structure 10, the device-side electrode D1 and the lead frame-side electrode L1 are electrically connected via the copper wire, i.e., the first wire 12, the ball bond 13, and the second wire 14.

The ball bond 13 is the wire 130 that been deformed, and includes copper as its main component, while the device-side electrode D1 includes Al as its main component. As shown in FIG. 6, the rubbed portion 12c has the coating 12b that is at least one layer, and the coating 12b is made of material that inhibits the Cu atoms and the Al atoms from mutually diffusing. The joint structure 10 of the first example embodiment is a structure in which a copper layer formed by the core wire 12a that includes copper as its main component is covered by the coating 12b. Therefore, with the joint structure 10, mutual diffusion of the Cu atoms in the ball bond 13 and the Al atoms in the device-side electrode D1 is inhibited.

(Another Example of a Joint Structure)

Figure 7:
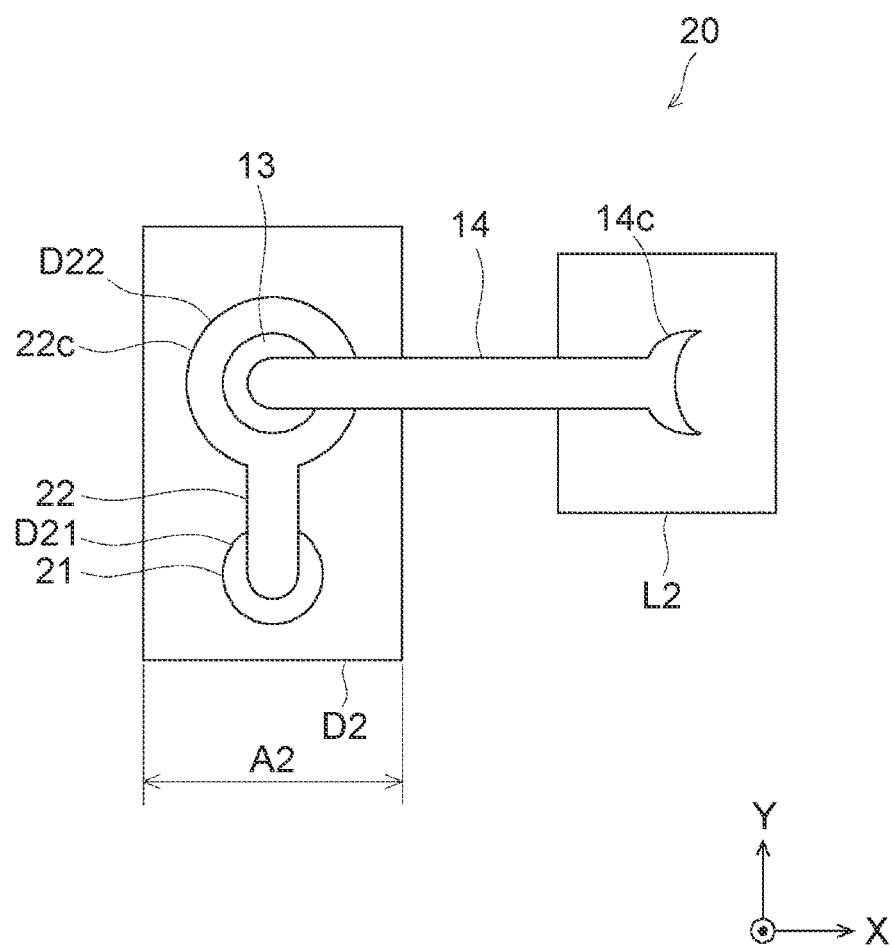
FIG. 7 is a plan view of another example of a joint structure formed using the copper wire joining method according to the first example embodiment.

Next, another example of a joint structure formed using the copper wire joining method according to the first example embodiment will be described with reference to FIG. 7. FIG. 7 is a plan view of another example of a joint structure formed using the copper wire joining method according to the first example embodiment. A joint structure according to a second example embodiment has the same structure as the joint structure 10 (see FIG. 5), except for the preliminary bond and the first wire, so only structure that is different will be described.

As shown in FIG. 7, a joint structure 20 includes a preliminary bond 21, and a first wire 22. Although the first wire 22 extends from the preliminary bond 21 to the ball bond 13, the direction in which the first wire 22 extends is a direction that intersects with the second wire 14, or more specifically, is a direction that is essentially perpendicular to the second wire 14 (here, toward the minus side in the direction of the Y axis). Therefore, a length A2 of a device-side electrode D2 in the direction in which the second wire 14 extends (here, the direction of the X axis) is shorter than a length A1 of the device-side electrode D1 of the joint structure 10 (see FIG. 5) in the direction in which the second wire 14 extends. The direction in which the second wire 14 extends is also the direction in which the device-side electrode D1 or D2 and the lead frame-side electrode L1 or L2 are lined up. Therefore, the joint structure 20 is shorter than the joint structure 10 in the direction in which the device-side electrode D1 or D2 and the lead frame-side electrode L1 or L2 are lined up. The joint between the ball bond 13 and the device-side electrode D2 is a ball bond, so the length of the device-side electrode D2 in the direction of the second wire 14 tends to be shorter than it is with a stitch bond that has the same level of joining area or joint strength.

Further, the joint structure 20 has the joint between the ball bond 13 and the device-side electrode D2, similar to the joint structure 10, and a decrease in the durability of this joint is inhibited.

(Example of a Semiconductor Device)

Figure 8:
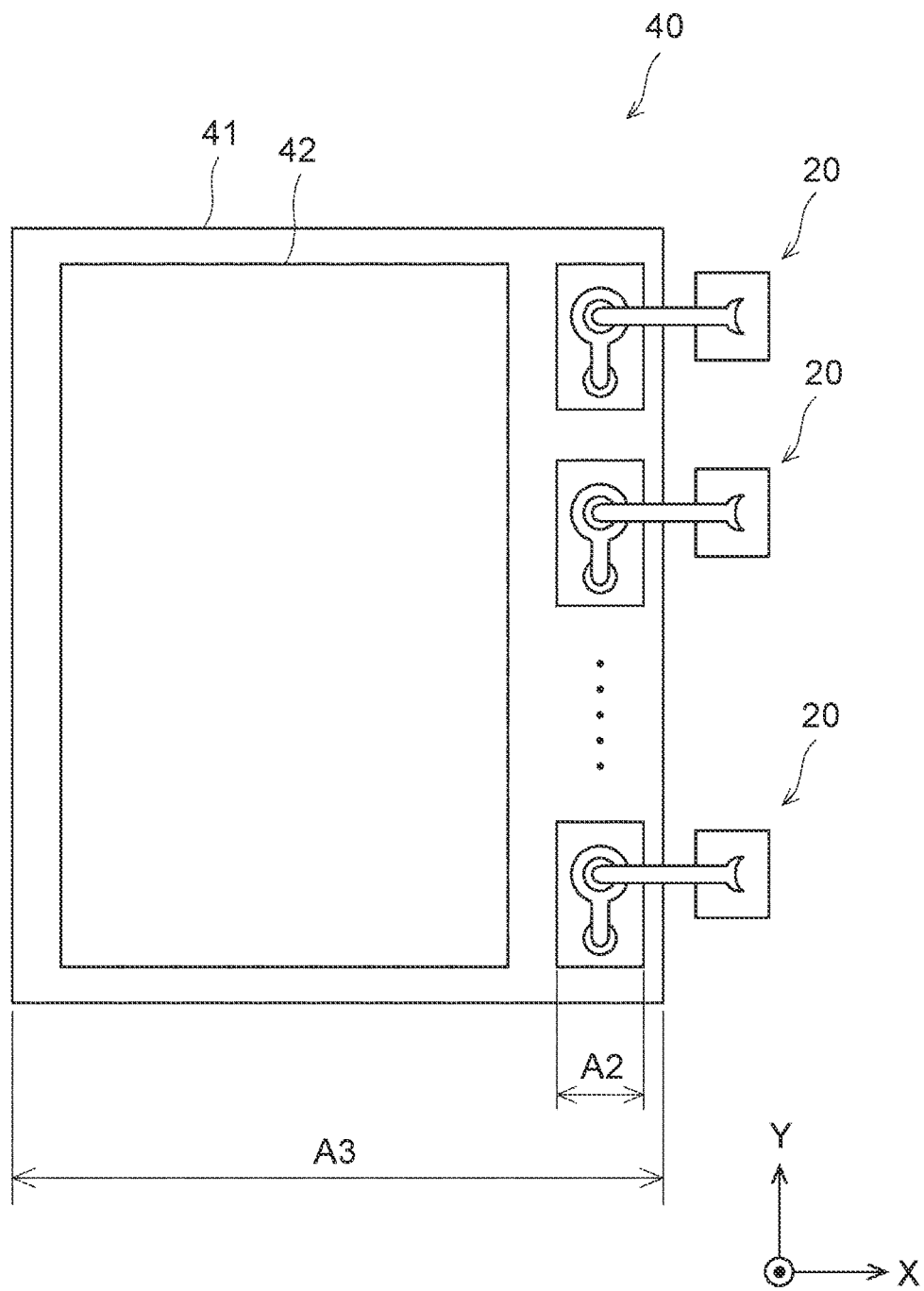
FIG. 8 is a plan view of a semiconductor device having the other example of the joint structure formed using the copper wire joining method according to the first example embodiment.

Next, a semiconductor device having the other example of the joint structure formed using the copper wire joining method according to the first example embodiment will be described with reference to FIG. 8. FIG. 8 is a plan view of a semiconductor device having the other example of the joint structure formed using the copper wire joining method according to the first example embodiment.

As shown in FIG. 8, a semiconductor device 40 includes a substrate 41, a device 42 mounted on the substrate 41, and a plurality of the joint structures 20. The plurality of joint structures 20 are such that copper wires are joined to electrodes of the device 42 and the lead frame-side electrodes L2 (see FIG. 7). Further, the plurality of joint structures 20 are arranged lined up in a direction along a side portion of the device 42 (here, in the direction of the Y axis).

There is a semiconductor device, not shown, that has the same structure as the semiconductor device 40 except that it includes the joint structure 10. As described above, the length A2 of the device-side electrode D2 of the joint structure 20 in the direction in which the second wire 14 extends (here, the direction of the X axis) is shorter than the length A1 of the device-side electrode D1 of the joint structure 10 (see FIG. 5) in the direction in which the second wire 14 extends. Therefore, a length A3 of the semiconductor device 40 in the direction in which the substrate 41 and the lead frame-side electrode L2 are lined up (here, the direction of the X axis) is shorter than the length of the semiconductor device in the same direction. Therefore, the semiconductor device 40 is short and compact in the direction in which the substrate 41 and the lead frame-side electrode L2 are lined up.

As described above, each of the joint structures 20 has the joint between the ball bond 13 and the device-side electrode D2, and a decrease in the durability of this joint is inhibited. Therefore, the semiconductor device 40 has the joint structures 20 that each have the joint in which a decrease in durability is inhibited, while also being compact. Therefore, the semiconductor device 40 may also be used mounted in a variety of movable objects such as a passenger vehicle, an inverted two-wheel apparatus, and a robot.

The example embodiments described above are not limited to the example embodiments described above, and may also be modified as appropriate without departing from the scope thereof. For example, with the copper wire joining method according to the first example embodiment, the preliminary bond 11 and the rubbed portion 12*c* are formed on the same device-side electrode D1, but the preliminary bond 11 and the rubbed portion 12*c* may also be formed one on one surface of one body and the other on one surface of another different body. Also, the preliminary bond 11 may be omitted as necessary.

What is claimed is:

1. A joining method for joining a copper wire and an electrode together, the copper wire that has a core wire that includes copper as a main component, and a coating that covers the core wire and includes a noble metal as a main component, the joining method comprising:
    moving a capillary that is able to move in three-dimensional directions, along a surface of the electrode that includes aluminum as a main component, while feeding the copper wire out from a tip end of the capillary, and pressing the copper wire against the electrode;
    moving the capillary away from the electrode;
    heating the copper wire at the tip end of the capillary after moving the capillary away from the electrode; and
    pushing a ball formed by heating and melting the copper wire at the tip end of the capillary against a rubbed portion formed by pressing the copper wire against the electrode.

2. The joining method according to claim 1, wherein when moving the capillary while pressing the copper wire against the electrode, the capillary is moved in a specific direction along the surface of the electrode, and then the capillary is moved in the opposite direction of the specific direction.

3. The joining method according to claim 1, wherein the rubbed portion is formed such that the coating of the copper wire remains on a surface of the rubbed portion that contacts the electrode.

4. The joining method according to claim 1, wherein the ball fits to an inside of an outer edge of the rubbed portion, when the surface of the electrode is viewed from a direction perpendicular with respect to the surface of the electrode.

5. The joining method according to claim 1, wherein the copper wire fed out from the tip end of the capillary is pressed against the electrode by bringing the capillary close to the electrode.

6. The joining method according to claim 1, wherein before forming the rubbed portion, a preliminary bond is formed by heating and melting the copper wire at the tip end of the capillary, and pressing the melted copper wire against the electrode at a position a predetermined distance away, along the surface of the electrode, from the position where the rubbed portion is formed on the surface of the electrode.

7. The joining method according to claim 6, wherein the preliminary bond, the rubbed portion, and the ball are formed by a continuous single copper wire.

8. The joining method according to claim 1, wherein a center portion of the rubbed portion is recessed.

9. A joint structure comprising:
    a copper wire that has a core wire that includes copper as a main component, and a coating that covers the core wire and includes a noble metal as a main component;
    an electrode that includes aluminum as a main component;
    a ball that is joined to a tip end of the copper wire, and that is made from the copper wire being melted and then solidified; and
    a disc-shaped body that is joined to the ball and the electrode and positioned between the ball and the electrode, and that has a coating that includes a noble metal as a main component.

10. The joint structure according to claim 9, wherein the disc-shaped body has a copper layer that includes copper as a main component, and is covered by the coating.

11. The joint structure according to claim 9, wherein the ball fits to an inside of an outer edge of the disc-shaped body, when a surface of the electrode is viewed from a direction perpendicular with respect to the surface of the electrode.

12. The joint structure according to claim 9, wherein a center portion of the disc-shaped body is recessed.

13. The joint structure according to claim 9, further comprising:

a preliminary bond formed by heating and melting the copper wire at a tip end of the capillary, and pressing the melted copper wire against the electrode at a position a predetermined distance away, along the surface of the electrode, from a position where the disc-shaped body is formed on the surface of the electrode.

* * * * *